(12) United States Patent  (10) Patent No.: US 8,179,273 B2
Feight  (45) Date of Patent: *May 15, 2012

(54) FAULTED CIRCUIT INDICATOR WITH FAULT CHARACTERISTIC DETECTION AND DISPLAY

(75) Inventor: Laurence V. Feight, Island Lake, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 466 days.

This patent is subject to a terminal disclaimer.

(21) Appl. No.: 12/394,880

(22) Filed: Feb. 27, 2009

(65) Prior Publication Data

US 2009/0219164 A1    Sep. 3, 2009

Related U.S. Application Data

(60) Provisional application No. 61/032,866, filed on Feb. 29, 2008.

(51) Int. Cl.
*G08B 21/00* (2006.01)
(52) U.S. Cl. ............ 340/653; 340/539.26; 340/531
(58) Field of Classification Search .......... 340/653, 340/654, 639, 643, 635, 651, 657, 664, 539.1, 340/650, 531, 638, 539.26, 680
See application file for complete search history.

(56) References Cited

U.S. PATENT DOCUMENTS

| | | | |
|---|---|---|---|
| 3,676,740 A | 7/1972 | Schweitzer | |
| 3,702,966 A | 11/1972 | Schweitzer | |
| 3,708,724 A | 1/1973 | Schweitzer | |
| 3,715,742 A | 2/1973 | Schweitzer | |
| 3,725,832 A | 4/1973 | Schweitzer | |
| 3,781,682 A | 12/1973 | Schweitzer | |
| 3,816,816 A | 6/1974 | Schweitzer | |
| 3,866,197 A | 2/1975 | Schweitzer | |
| 3,876,911 A | 4/1975 | Schweitzer | |
| 3,906,477 A | 9/1975 | Schweitzer | |
| 4,063,171 A | 12/1977 | Schweitzer | |
| 4,152,643 A | 5/1979 | Schweitzer | |
| 4,234,847 A * | 11/1980 | Schweitzer | 324/146 |
| 4,298,864 A * | 11/1981 | Mahnke et al. | 340/657 |
| 4,375,617 A | 3/1983 | Schweitzer | |
| 4,438,403 A | 3/1984 | Schweitzer | |
| 4,456,873 A | 6/1984 | Schweitzer | |
| 4,458,198 A | 7/1984 | Schweitzer | |
| 4,495,489 A | 1/1985 | Schweitzer | |
| 4,794,329 A | 12/1988 | Schweitzer | |
| 4,794,331 A | 12/1988 | Schweitzer | |
| 4,794,332 A | 12/1988 | Schweitzer | |
| 4,795,982 A | 1/1989 | Schweitzer | |

(Continued)

OTHER PUBLICATIONS

Horstmann GmbH 2006 Edition Product Category Retrieved date Mar. 4, 2009 http:mvtechnology.com.au/Download%20Library/Catalogue%20SCI%20&20EFI%20Edition%202006..pdf.

(Continued)

*Primary Examiner* — Daniel Previl
(74) *Attorney, Agent, or Firm* — Eugene M. Cummings P.C.

(57) ABSTRACT

A display for a faulted circuit indicator is disclosed. A plurality of light-emitting diodes are arranged so that at least one diode is visible to a person approaching the faulted circuit indicator from a determined angle of approach. When a fault is detected, the faulted circuit indicator flashes the plurality of light-emitting diodes in a predetermined pattern depending on whether a permanent or temporary fault is detected.

18 Claims, 11 Drawing Sheets

U.S. PATENT DOCUMENTS

| | | | |
|---|---|---|---|
| 4,873,706 A | 10/1989 | Schweitzer | |
| 4,904,932 A | 2/1990 | Schweitzer | |
| 4,984,124 A | 1/1991 | Yeh | |
| 5,008,651 A | 4/1991 | Schweitzer | |
| 5,045,778 A | 9/1991 | Thibodeau | |
| 5,070,301 A | 12/1991 | Schweitzer | |
| 5,077,520 A | 12/1991 | Schweitzer | |
| 5,095,265 A | 3/1992 | Schweitzer | |
| 5,153,565 A | 10/1992 | Schweitzer | |
| 5,168,414 A | 12/1992 | Horstmann | |
| 5,180,972 A | 1/1993 | Schweitzer | |
| 5,220,311 A | 6/1993 | Schweitzer | |
| 5,274,324 A | 12/1993 | Schweitzer | |
| 5,363,088 A | 11/1994 | Schweitzer | |
| 5,406,195 A | 4/1995 | Schweitzer | |
| 5,420,502 A | 5/1995 | Schweitzer | |
| 5,677,623 A | 10/1997 | Schweitzer | |
| 5,677,678 A | 10/1997 | Schweitzer | |
| 5,729,125 A | 3/1998 | Schweitzer | |
| 5,754,383 A | 5/1998 | Huppertz | |
| 5,821,869 A | 10/1998 | Schweitzer | |
| 5,889,399 A | 3/1999 | Schweitzer | |
| 5,920,451 A * | 7/1999 | Fasano et al. | 361/45 |
| 5,959,537 A | 9/1999 | Banting | |
| 5,990,674 A | 11/1999 | Schweitzer | |
| 6,014,301 A | 1/2000 | Schweitzer | |
| 6,016,105 A | 1/2000 | Schweitzer | |
| 6,043,433 A | 3/2000 | Schweitzer | |
| 6,133,723 A | 10/2000 | Feight | |
| 6,133,724 A | 10/2000 | Schweitzer | |
| 6,211,764 B1 | 4/2001 | Schweitzer | |
| 6,429,661 B1 | 8/2002 | Schweitzer | |
| 6,433,698 B1 | 8/2002 | Schweitzer | |
| 6,479,981 B2 * | 11/2002 | Schweitzer et al. | 324/133 |
| 6,734,662 B1 | 5/2004 | Fenske | |
| 6,798,211 B1 * | 9/2004 | Rockwell et al. | 324/527 |
| 6,822,576 B1 | 11/2004 | Feight | |
| 6,894,478 B1 * | 5/2005 | Fenske | 324/127 |
| 6,949,921 B1 | 9/2005 | Feight | |
| 6,963,197 B1 | 11/2005 | Feight | |
| 7,023,691 B1 | 4/2006 | Feight | |
| 7,053,601 B1 | 5/2006 | Fenske | |
| 7,106,048 B1 | 9/2006 | Feight | |
| 7,205,495 B2 | 4/2007 | Mazur | |
| 7,248,158 B2 | 7/2007 | Berkman | |
| 2005/0040809 A1 * | 2/2005 | Uber et al. | 324/117 R |
| 2009/0009180 A1 | 1/2009 | Varghai | |
| 2009/0039788 A1 * | 2/2009 | Smith et al. | 315/86 |

OTHER PUBLICATIONS

PCT, International Search Report for PCT/US2009/035502, May 27, 2009.

PCT, Written Opinion of the International Searching Authority, May 17, 2009.

2006 Edition Product Category. Dipl.-ing. H. Horstmann Gmbh [retrieved on Mar. 4, 2009]. Retrieved from the internet: <URL: http://www.mvtechnology.com.au/Download%20Library/Catalogue%20SCI%20&%20EFI%20Edition%20202006..pdf>.

PCT, International Search Report for PCT/US2009/035509, Apr. 28, 2009.

PCT, Written Opinion of the International Searching Authority for PCT/US2009/035509, Apr. 28, 2009.

* cited by examiner

FAULTED CIRCUIT INDICATOR WITH FAULT CHARACTERISTIC DETECTION AND DISPLAY

CROSS-REFERENCE TO RELATED APPLICATIONS

This application claims priority under 35 U.S.C. §119(e) to U.S. Provisional Application 61/032,866, entitled "FAULTED CIRCUIT INDICATOR WITH FAULT CHARACTERISTIC DETECTION & DISPLAY," filed on Feb. 29, 2008 on behalf of inventor Laurence Virgil Feight.

FIELD OF THE INVENTION

The present invention relates generally to systems, apparatus, and methods for indicating the presence of a fault in a power transmission or distribution system, and more particularly, to systems, apparatus, and methods for distinguishing between a permanent and temporary fault by lighting and darkening a sequence of lamps in a specified sequence.

DESCRIPTION OF THE PRIOR ART

Various types of self-powered faulted circuit indicators ("FCIs") have been constructed for detecting electrical faults in power distribution systems, including clamp-on type fault indicators, which clamp directly over cables in the systems and may derive their operating power from inductive and/or capacitive coupling to the monitored conductor; and test point type fault indicators, which are mounted over test points on cables or associated connectors of the systems and may derive their operating power from capacitive coupling to the monitored conductor. Other prior art FCIs may be either of the manually resetting type, wherein it is necessary that the indicators be physically reset, or of the self-resetting type, wherein the indicators are reset upon restoration of line current. Examples of such FCIs are found in certain products manufactured by Schweitzer Engineering Laboratories, as well as described in U.S. Pat. Nos. 3,676,740, 3,906,477, 4,063,171, 4,234,847, 4,375,617, 4,438,403, 4,456,873, 4,458,198, 4,495,489, 4,974,329, 5,220,311, 5,677,678, 6,016,105, 6,133,723, 6,133,724, 6,822,576, 6,949,921, 6,963,197, 7,023,691, 7,053,601, 7,106,048, 7,271,580, and 7,315,169, all of which are hereby incorporated by reference.

Detection of fault currents in a monitored conductor by an FCI is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the FCI may be manually reset. In addition, some prior art FCIs have distinguished between the display of temporary faults and permanent faults. For example, the Schweitzer Engineering Laboratories Model AR-OH ("AutoRANGER") uses two downward-facing red light-emitting diodes (LEDs) to indicate a permanent fault, and a single yellow LED to indicate a temporary fault.

Various prior art FCIs have utilized LEDs. Generally, FCIs are small, battery-powered devices, and therefore, fully illuminating a high-intensity LED during daylight hours may quickly consume the battery of the FCI. In addition, the physical construction of FCIs has usually involved placing LEDs on the bottom or one of the sides of the FCI, making daytime visibility difficult if a lineman is not facing the appropriate surface of the FCI.

OBJECTS OF THE INVENTION

Accordingly, it is an object of this invention to provide a system, apparatus, and method for better displaying a fault indication, as well as traits of a detected fault.

Another object of this invention is to provide a system, apparatus, and method for visually distinguishing between a temporary and permanent fault, so that the distinction is discernible even during daytime hours.

Other advantages of the disclosed invention will be clear to a person of ordinary skill in the art. It should be understood, however, that a system, method, or apparatus could practice the disclosed invention while not achieving all of the enumerated advantages, and that the protected invention is defined by the claims.

SUMMARY OF THE INVENTION

The disclosed invention achieves these objectives by providing a faulted circuit indicator with a sophisticated display comprised of a plurality of high-intensity light-emitting diodes ("LEDs") arranged so that at least one diode will be visible to a person approaching the faulted circuit indicator from a determined angle of approach. An angle of approach is determined at the time that the FCI is installed on the power line. The person installing the FCI may determine the angle of approach based on the location of the power line, location of or direction to an access road to the power line, or the like. The use of high-intensity LEDs provides excellent visibility, even during daytime hours, and the use of a flashing pattern limits battery usage to acceptable levels. In one embodiment, the faulted circuit indicator comprises a housing, a current acquisition circuit disposed within the housing, and a monitoring circuit coupled to the current acquisition circuit for determining the occurrence of a fault on a monitored power line. When a fault is detected, the monitoring circuit then flashes a plurality of LEDs in a predetermined sequence or pattern, wherein the LEDs are disposed on or in the faulted circuit indicator so that at least one LED is visible regardless of the angle of approach of a person.

The faulted circuit indicator may further include a clear end cap, and the plurality of LEDs could be disposed within the clear end cap. The end cap would hang downward when installed so that the LEDs would be visible to any approaching personnel. In one embodiment, there would be six LEDs disposed on a flexible printed circuit board attached to a hexagonal post within the faulted circuit indicator. Each LED would be disposed on a separate face of the hexagonal post. The LEDs could consist of two groups of different colored LEDs, where LEDs of different colors are disposed next to one another. Where a permanent fault is detected, the LEDs would flash in a flashing sequence so that a pair of LEDs of different colors, such as, for example, red and yellow, are illuminated for a time, before the next pair is illuminated. However, if the fault condition were to clear within a predetermined time period after its detection, such as two minutes, the rotating flash pattern is stopped, and replaced by a flashing of only one color LEDs to indicate the occurrence of a temporary fault.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

DETAILED DESCRIPTION OF THE ILLUSTRATED EMBODIMENT

Figure 1:
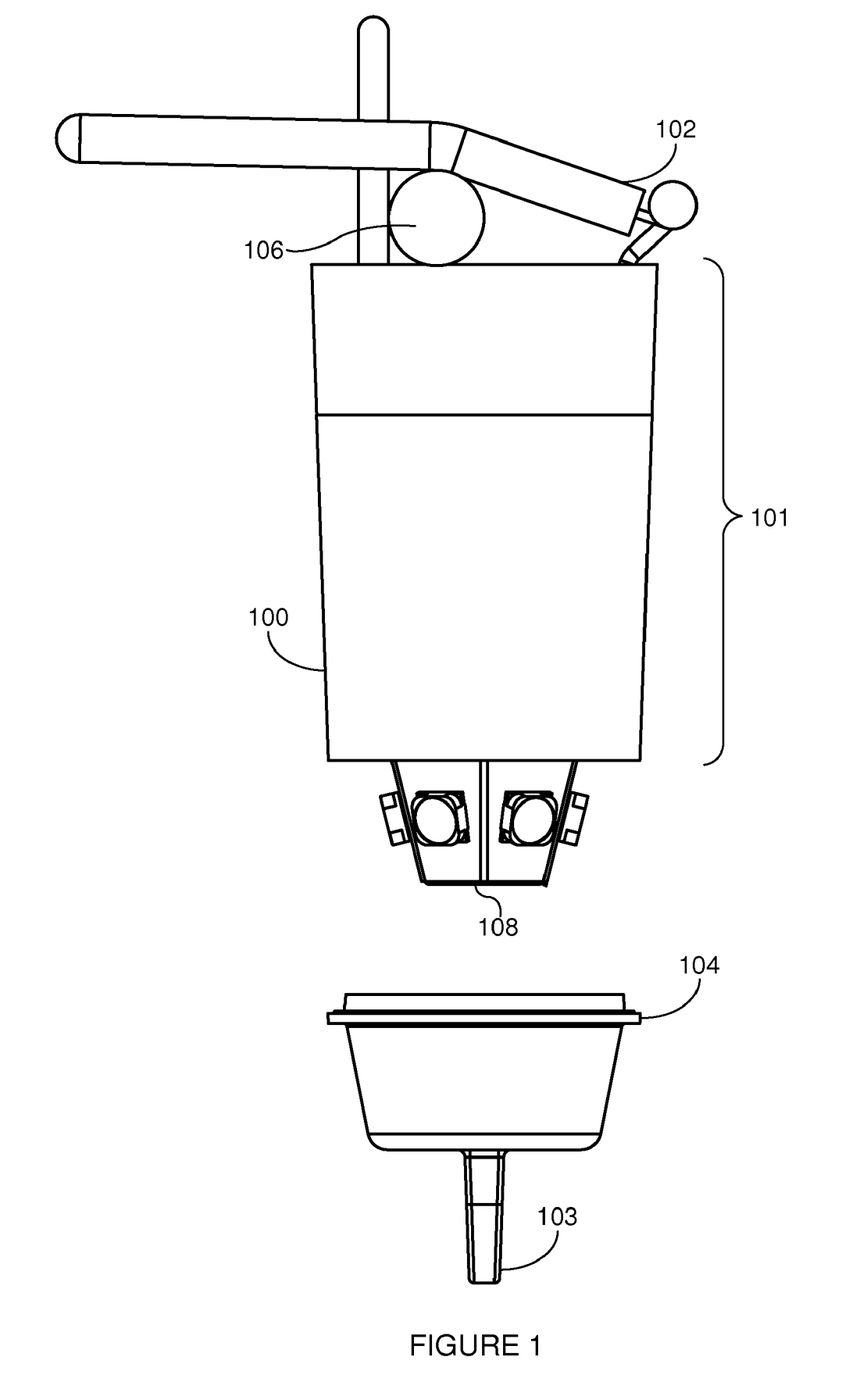
FIG. 1 is a side view of a clamp-on faulted circuit indicator including a display constructed in accordance with an embodiment of the disclosed invention.

Turning to the Figures, and to FIG. 1 in particular, a faulted circuit indicator 100 constructed in accordance with the present invention is depicted. Faulted circuit indicator 100 includes a housing 101 containing circuitry for sensing currents in a power line (not shown) and for indicating when fault currents are sensed. A clamp 102 is coupled to the housing 101 by a spring mechanism allowing the clamp 102 to pivot. The clamp 102 couples the faulted circuit indicator 100 to the power line 106.

The faulted circuit indicator includes an end cap 104 with a protruding eye 103, which allows for the use of a hot stick during installation or removal. As drawn, the end cap 104 is not joined to the housing 101, but would, in a finished product, be sealed to the housing 101. The end cap 104 may be joined to the housing 101 by a number of prior art methods, such as sonic welding, but preferably is joined so that moisture and other contaminants cannot access the interior of the faulted circuit indicator 100. When installed on a power line, fault indicator 100 normally hangs so that the eye 103 is roughly perpendicular to the ground. This allows end cap 104 to be seen from any direction by approaching line personnel.

Figure 2:
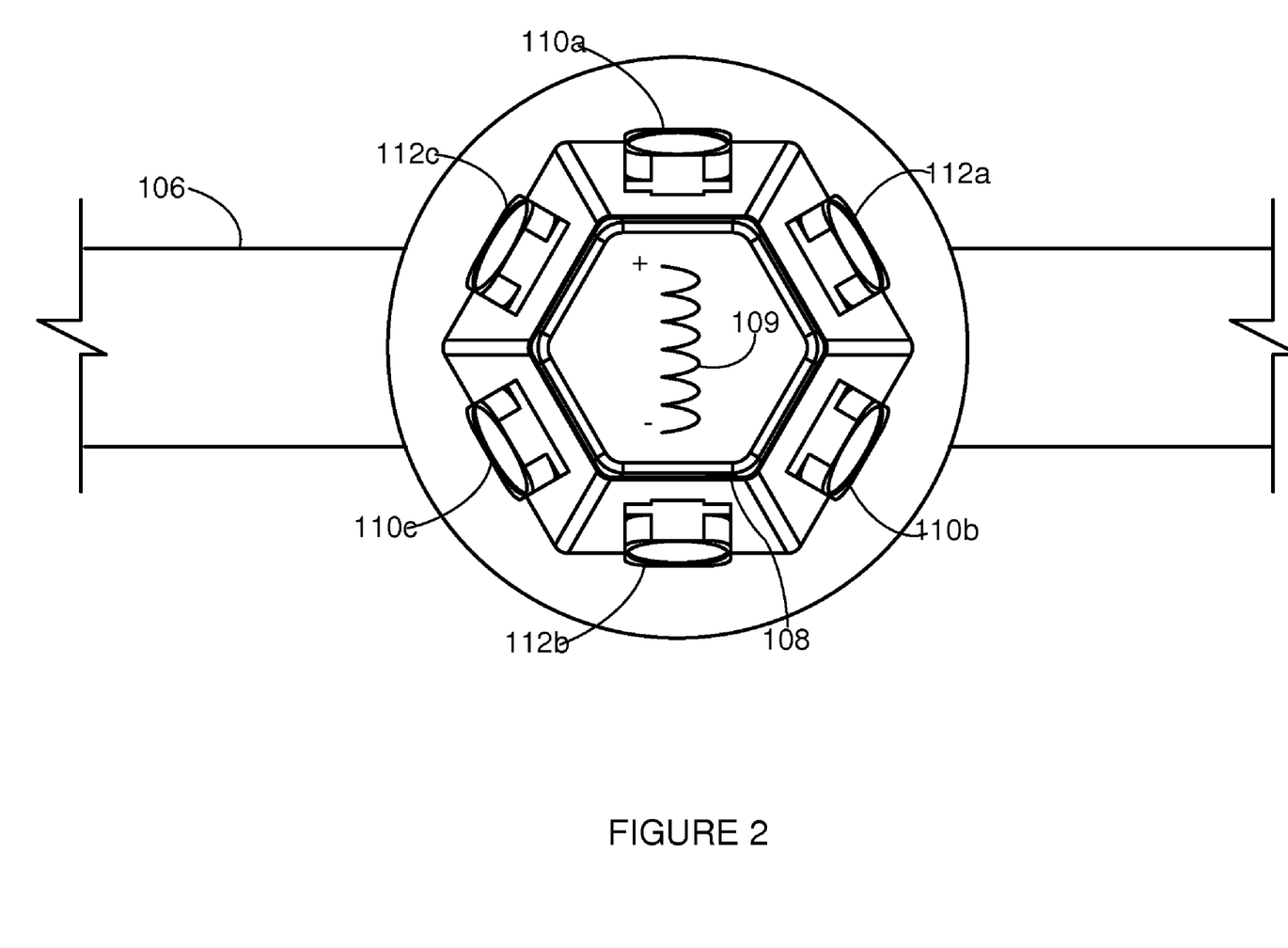
FIG. 2 is an exploded bottom view of the display of the faulted circuit indicator depicted in FIG. 1 installed on a power line, particularly showing the layout of light-emitting diodes in the display of the faulted circuit indicator in relation to the power line, in accordance with an embodiment of the disclosed invention.

The fault detecting circuitry of the faulted circuit indicator 100 may operate in accordance with any prior art fault detection means, such as that disclosed in U.S. application for patent Ser. No. 11/578,334, which is assigned to Schweitzer Engineering Laboratories, Inc. the assignee of the present application, and is hereby incorporated by reference. Turning to FIG. 2, the bottom of faulted circuit indicator 100 is displayed for an FCI installed on an power line, and in particular, six light-emitting diodes ("LEDs") 110a, 110b, 110c, 112a, 112b, 112c are shown in a hexagonal pattern. The LEDs 110a, 110b, 110c, 112a, 112b, 112c are mounted on a PC-board (not shown) affixed to a hexagonal mounting post 108. To improve visibility, the LEDs 110a, 110b, 110c, 112a, 112b, 112c may be high intensity 120 degree LEDs, even though each LED only covers a 60 degree arc. In addition, the faulted circuit indicator 100 is mounted to a power line 106 by clamp 102, which is designed to bring voltage coil 109 into close proximity with power line 106. As the current in the power line 106 increases, the voltage across coil 109 increases as well.

Figure 3:
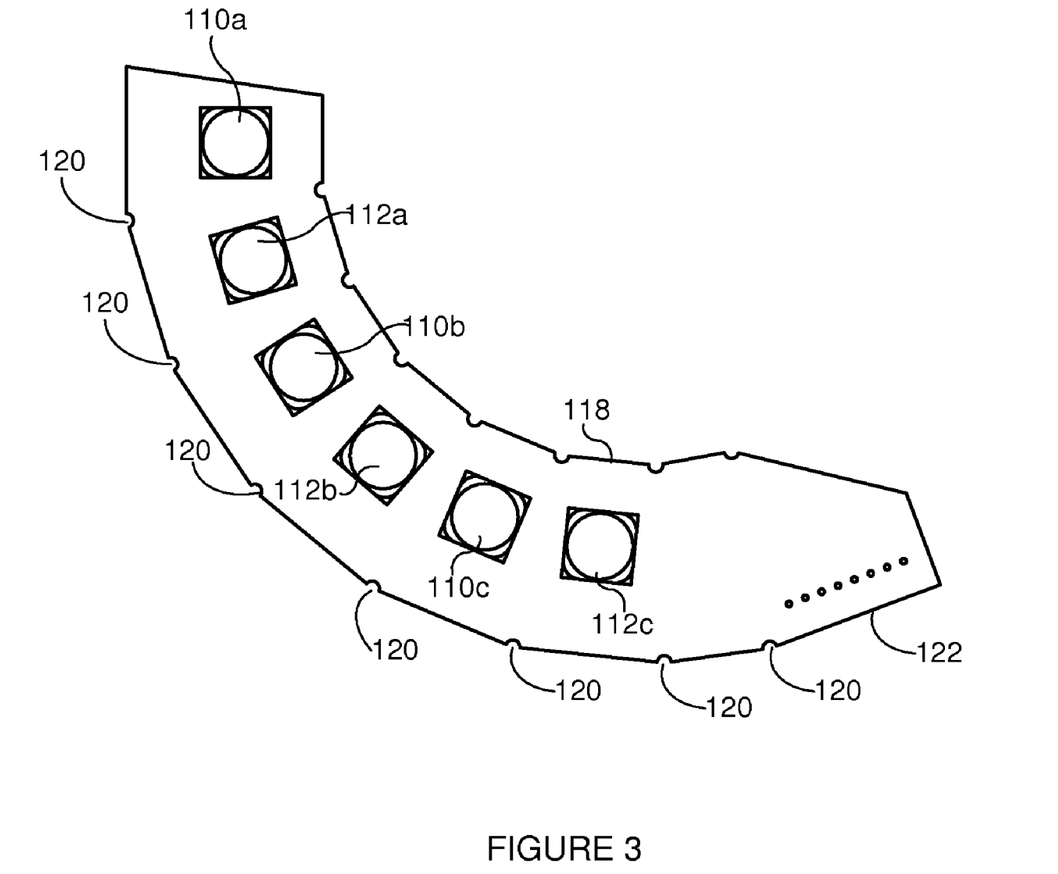
FIG. 3 depicts a flexible printed circuit board including the light-emitting diodes visible in FIG. 2, in accordance with an embodiment of the disclosed invention.

FIG. 3 depicts a flexible printed circuit board 118 populated with six LEDs 110a, 110b, 110c, 112a, 112b, 112c and various other components. The circuitry driving the six LEDs 110a, 110b, 110c, 112a, 112b, 112c may be any suitable prior art circuit. As shown, the printed circuit board 118 has seven sections as delineated by tabs 120 and a terminating tab 122. The sections and tab 122 are adapted to wrap around hexagonal post 108.

Figure 4A:
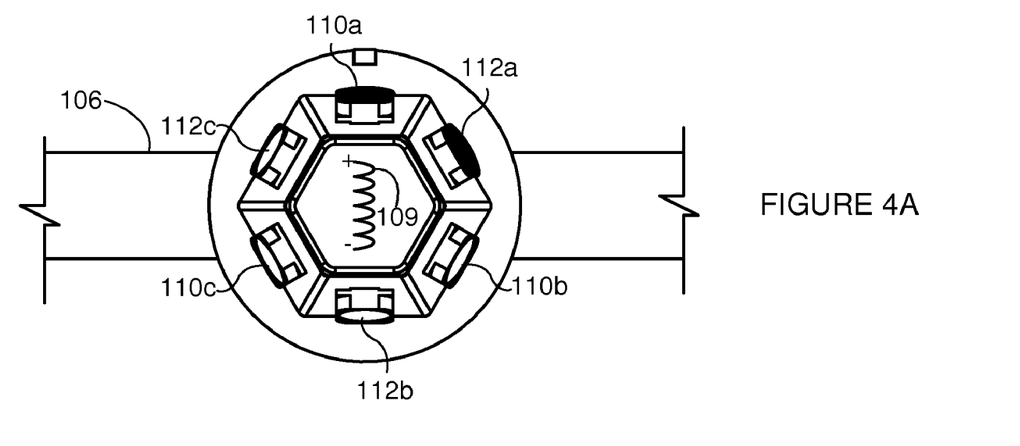
FIGS. 4A-4C depict an exploded bottom view of the faulted circuit indicator shown in FIG. 2, displaying one possible pattern of flashing the light-emitting diodes on detection of a permanent fault in accordance with an embodiment of the disclosed invention.
Figure 4B:
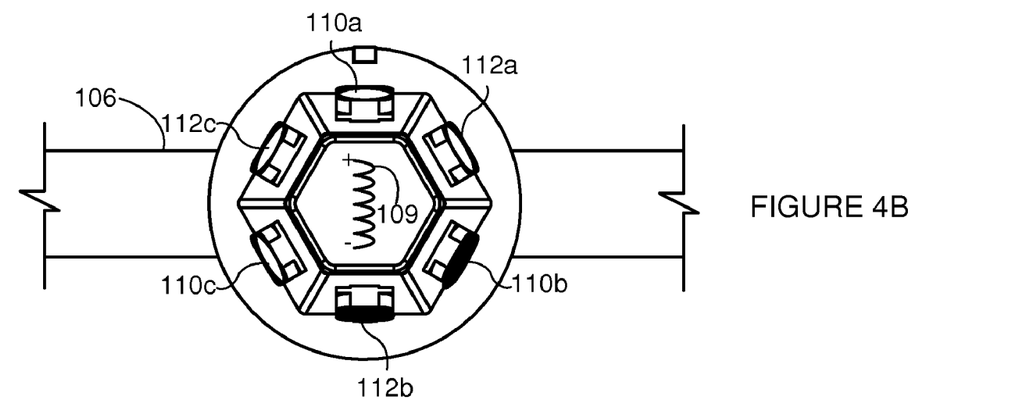
Figure 4C:
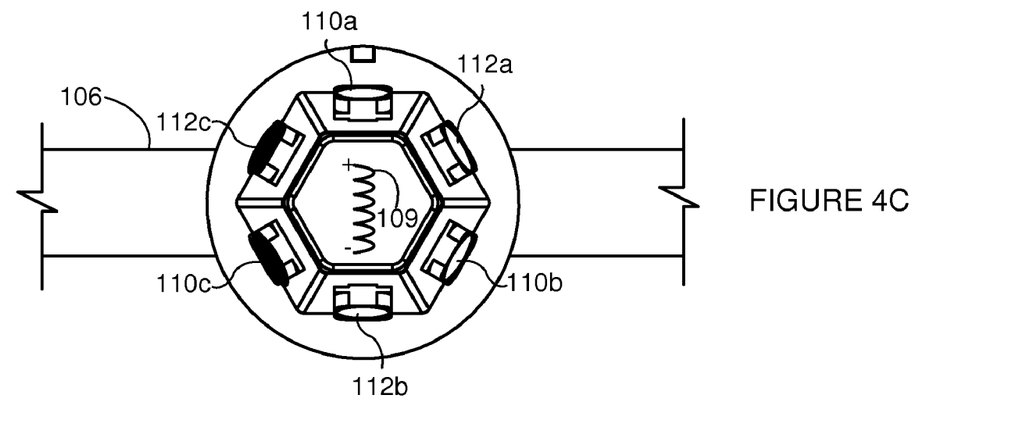
Figure 5A:
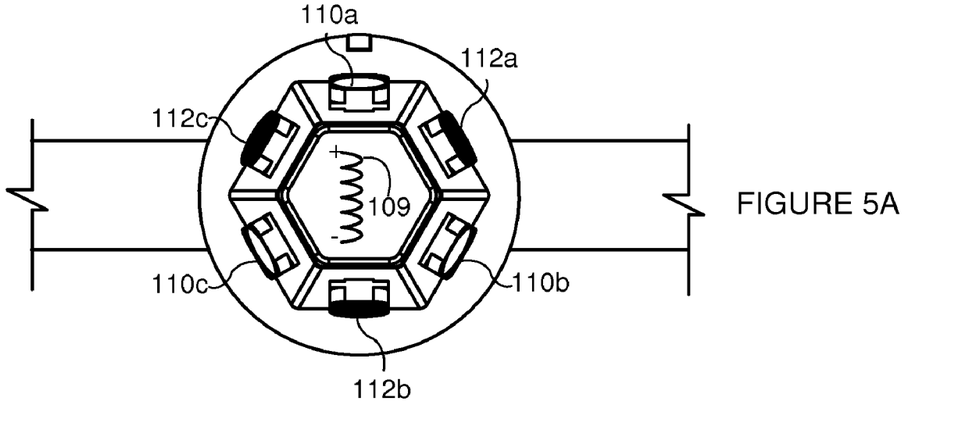
FIGS. 5A-5C depict an exploded bottom view of the faulted circuit indicator shown in FIG. 2, displaying one possible pattern of flashing the light-emitting diodes on detection of a temporary fault in accordance with an embodiment of the disclosed invention.
Figure 5B:
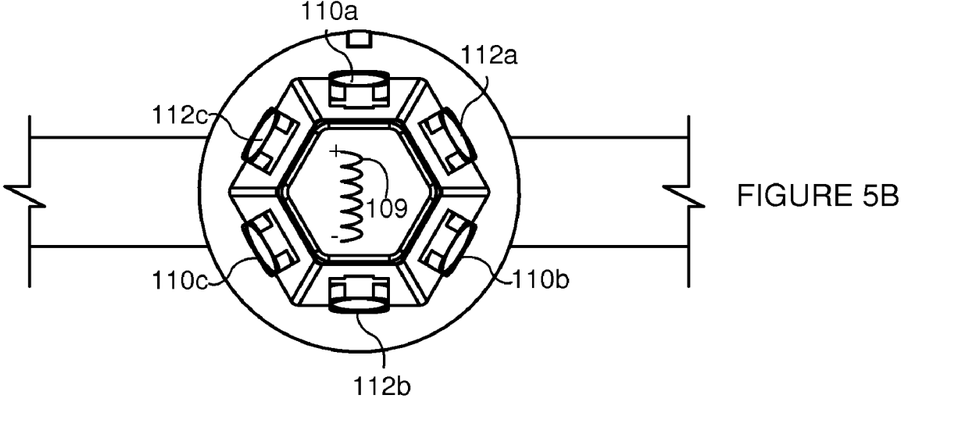
Figure 5C:
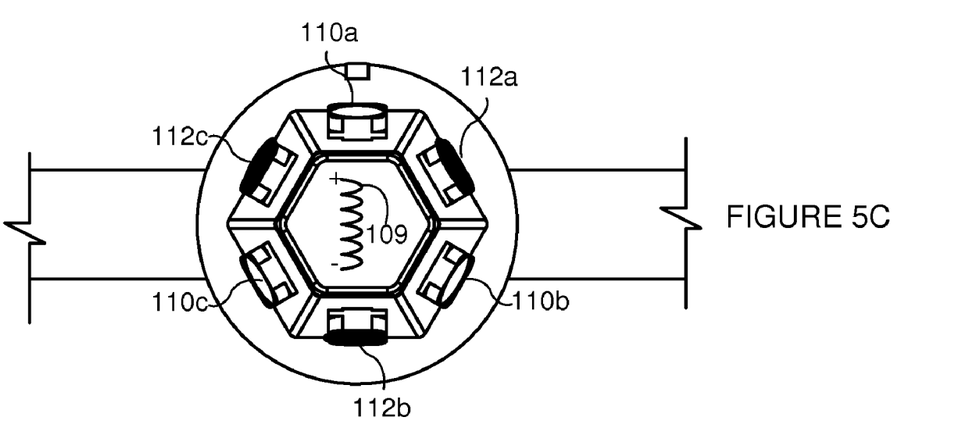

In one embodiment of the disclosed invention that applicant believes is especially suited for improving daytime visibility, each pair of LEDS, i.e., pairs 110a, 110b, 110c, 112a, 112b, 112c, may consist of different colored LEDs, such as one red LED and one yellow LED. When a permanent fault is detected by sensing either a change in voltage or current, the LEDs are illuminated two at a time in a predetermined sequence as depicted in FIGS. 4A-4C. In contrast, when a temporary fault is detected, only one LED from each pair of LEDs, such as the yellow LED, is flashed, as depicted in FIGS. 5A-5C. It is noted that, from a distance, it will be difficult to tell the difference between red and yellow LEDs, but the flashing sequence will be apparent, so a lineman will known of the presence of a permanent fault. The FCI continues to monitor the current level within the power line periodically, and if the voltage and/or current within the power line returns to normal within two minutes after a fault is detected, the LEDs will be configured to display a temporary fault. Alternatively, the FCI may change to display a temporary fault if the fault clears at any time after it was detected. When displaying a temporary fault, the LEDs of only one color, red or yellow in the present example, are flashed. If the LEDs are 120 degree LEDs, the temporary fault indication will be visible from any angle approaching the FCI 100.

FIGS. 4A-4C depict one LED flash sequence that would embody the disclosed invention, and in particular, a flash sequence that could be used to signify a permanent fault. As depicted, red LED 110a and yellow LED 112a are first illuminated in FIG. 4A. Those LEDs are darkened, and in FIG. 4B red LED 110b and yellow LED 112b are illuminated. In the third step of the sequence, red LED 110c and yellow LED 112c are illuminated, and the other LEDs are darkened.

FIGS. 5A-5C depict a separate LED flash sequence that would embody the disclosed invention, and in particular, a flash sequence that could be used to signify a permanent fault. As depicted, yellow LEDs 112a, 112b, and 112c are illuminated in FIG. 5A. Those LEDs are darkened in FIG. 5B and illuminated again in FIG. 5C.

Figure 6A:
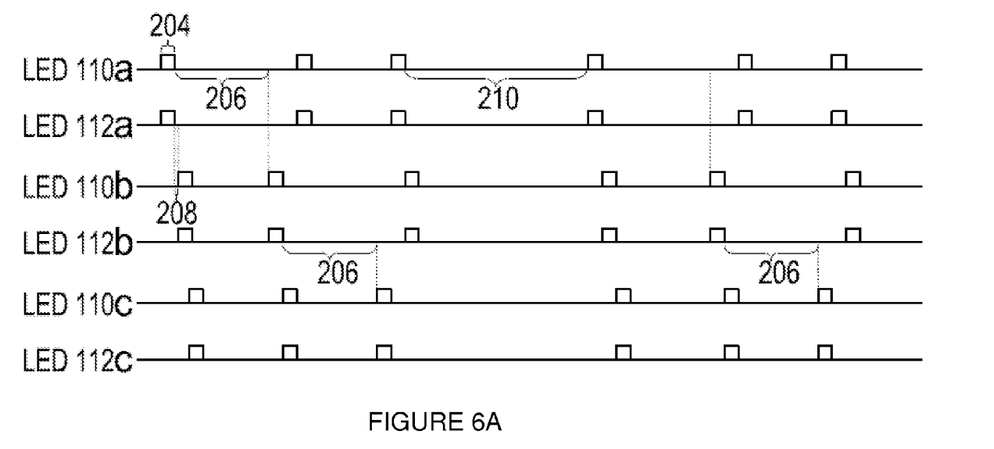
FIGS. 6A & 6B depict one possible sequence of timing diagrams, illustrating the chronological sequence of control signals applied to the light-emitting diodes of the faulted circuit indicator of FIG. 2 to display a permanent and temporary fault respectively, in accordance with an embodiment of the disclosed invention.

FIG. 6A shows a series of timing diagrams illustrating the temporal relation between control signals applied to different LEDs to achieve the flashing sequence illustrated in FIG. 5A. As illustrated, a first pair of LEDs is flashed for a brief period of time, followed by the other pairs in succession. A time period is allowed to lapse, and the flashing sequence is restarted, firing the second pair of LEDs first, and continuing as such until the triggering condition is resolved. In particular, LEDs 110a and 112a are simultaneously flashed for a time period 204. All LEDs are then darkened for a time period 208, which could be zero. Then, LEDs 110b and 112b are simultaneously flashed for a time period 204. Again, all LEDs are darkened for a time period 208, and LEDs 110c and 112c are simultaneously flashed for a time period 204.

From the time that LEDs 110a and 112a were flashed, a time period 206 is allowed to elapse prior to flashing them again. Then LEDs 110b and 112b are illuminated for a time period 204. These LEDs are darkened and a time period 208 is allowed to elapse. Then LEDs 110c and 112c are flashed for a time period 204 and then darkened, and a time period 208 is allowed to elapse. Finally, LEDs 110a and 112a are flashed for a time period 204. A time period 206 is allowed to elapse again, and the three pairs of LEDs are flashed in a similar sequence, starting with LEDs 110c and 112c. After the final sequence, all LEDs are darkened for a time period 210, at which point the flashing sequence repeats until the permanent fault is alleviated or another trigger causes a change in the display.

Figure 6B:
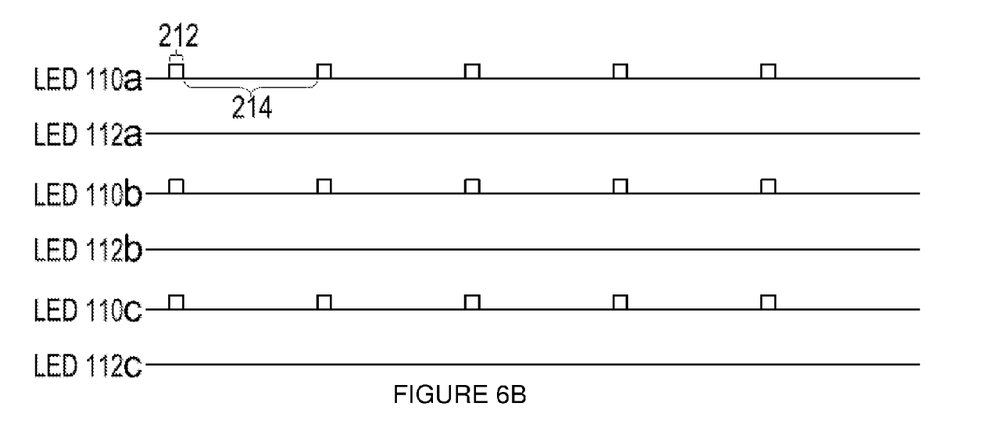

FIG. 6B shows a series of timing diagrams illustrating the temporal relation between control signals applied to different LEDs to achieve the flashing sequence illustrated in FIG. 5B. As depicted, the yellow LEDs 112a, 112b, and 112c are simultaneously flashed for a time period 212 and then darkened for a time period 214. The flashing sequence repeats until the temporary fault or other trigger is alleviated.

Figure 7A:
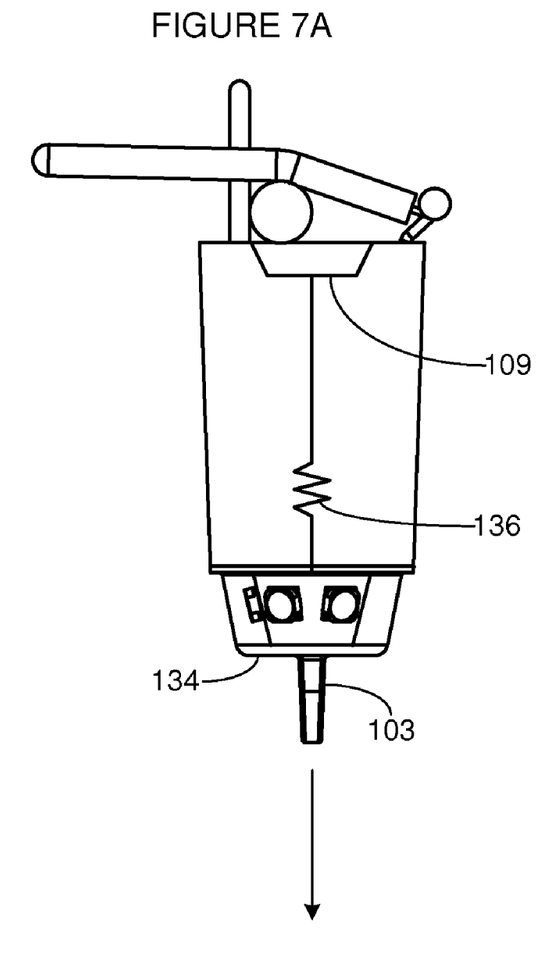
FIG. 7A is a perspective view of a clamp-on faulted circuit indicator incorporating a rotatable display constructed in accordance with an embodiment of the disclosed invention.
Figure 7B:
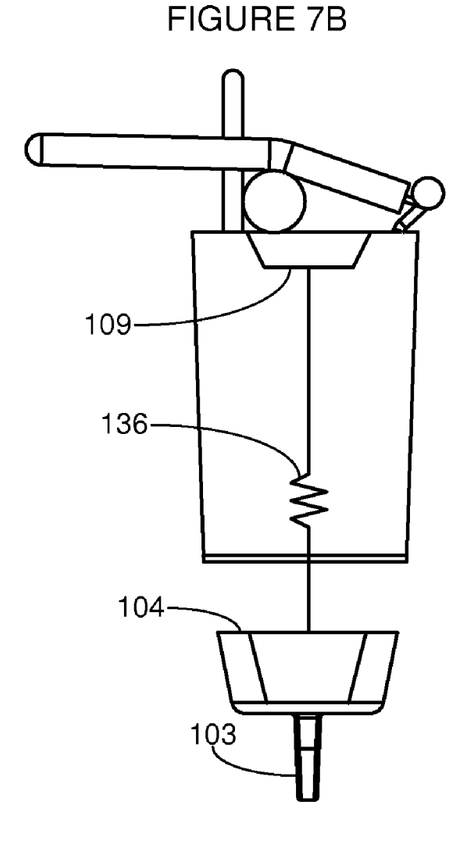
FIG. 7B is an additional perspective view of the faulted circuit indicator depicted in FIG. 7A, showing the rotatable display fully extended and rotated so that none of the light-emitting diodes in the display are visible.

FIGS. 7A and 7B depict an FCI 100 constructed in accordance with an embodiment of the disclosed invention that is especially useful if the FCI is only going to be viewed from a known trajectory. In this embodiment, the LED display 134 is coupled to a rotatable spring 136. The LED display, instead of including six LEDs, includes three LEDs, which will provide more than 180 degrees of exposure if 120 degree LEDs are used. Using a hotstick an installer can rotate the display 134 to be visible from the direction from which an installer will approach the FCI, making the display visible from the determined direction of approach. As LEDs use large amounts of power when they are activated, an FCI constructed in accordance with this embodiment of the disclosed invention could potentially have a much greater battery life than a similar FCI using multiple LEDs mounted to cover 360 degrees.

Figure 8:
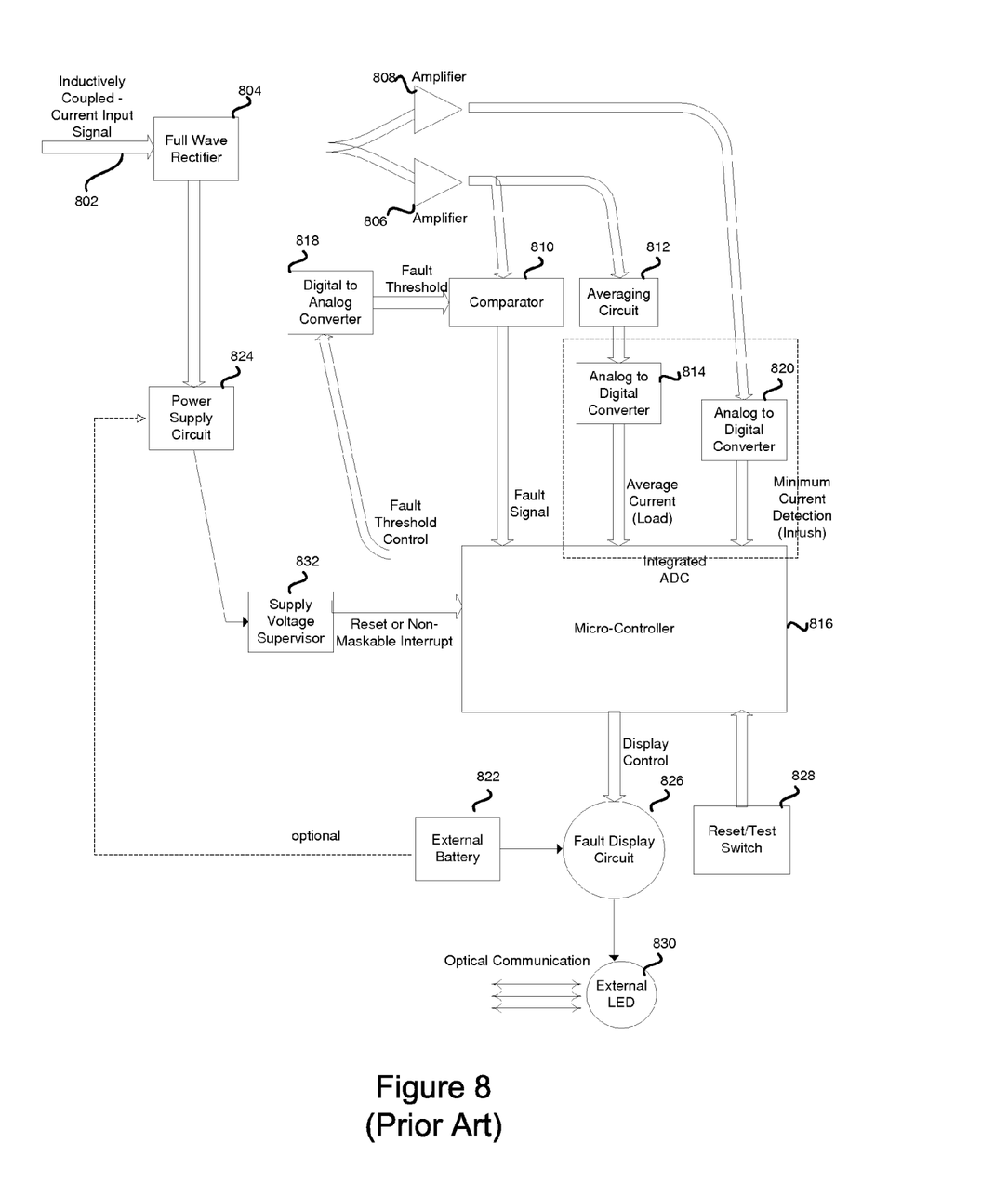
FIG. 8 is a block diagram of prior art current detection and monitoring circuitry for use with a faulted circuit indicator as constructed in accordance with an embodiment of the disclosed invention.

FIG. 8 is a block diagram of current acquisition and monitoring circuitry usable with the disclosed invention. This circuitry is identical to that pending in U.S. application Ser. No. 11/578,334, earlier incorporated by reference. The specific operation of this circuitry can be found described therein.

Figure 9:
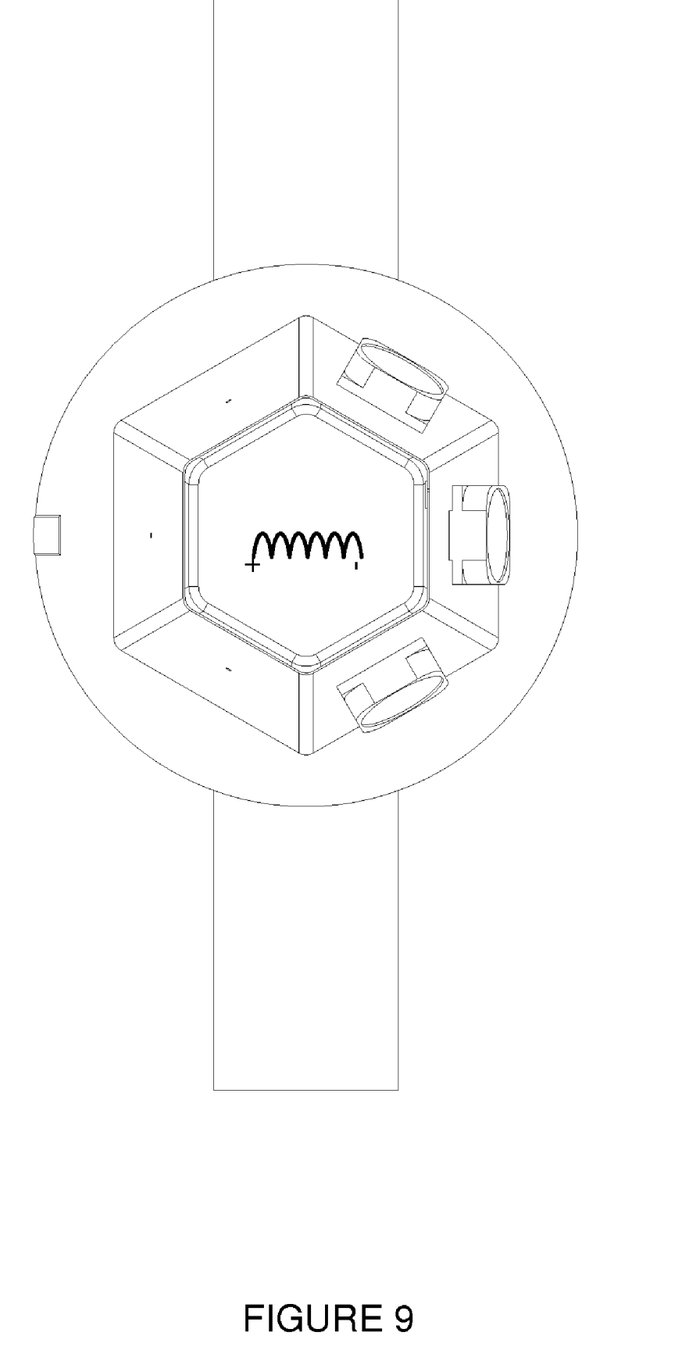
FIG. 9 depicts a bottom view of the faulted circuit indicator shown in FIG. 7A.

FIG. 9 depicts a bottom view of the faulted circuit indicator displayed in FIGS. 7A and 7B. As illustrated, this faulted circuit indicator includes three LEDs mounted on a rotatable display, which can be adjusted to provide a visible display viewable from more than 180 degrees from any determined angle of approach. The composition of the LEDs may be, for example, two red LEDs and one yellow LED, or two yellow LEDs and one red LED, and the LEDs may be flashed in distinct sequences to indicate the difference between a permanent or temporary fault. For example, to indicate a permanent fault, the two LEDs of similar color may be flashed simultaneously, followed by a zero-length or greater pause, followed by the flash of the other color LED, and followed by yet another pause, whereby the sequence would repeat. The time periods could be those used in FIG. 6A, discussed above. Similarly, to indicate a temporary fault, either the two LEDs of similar color, or the one LED having another color, may be periodically flashed similarly to the method described in FIG. 6B above.

Figure 10:
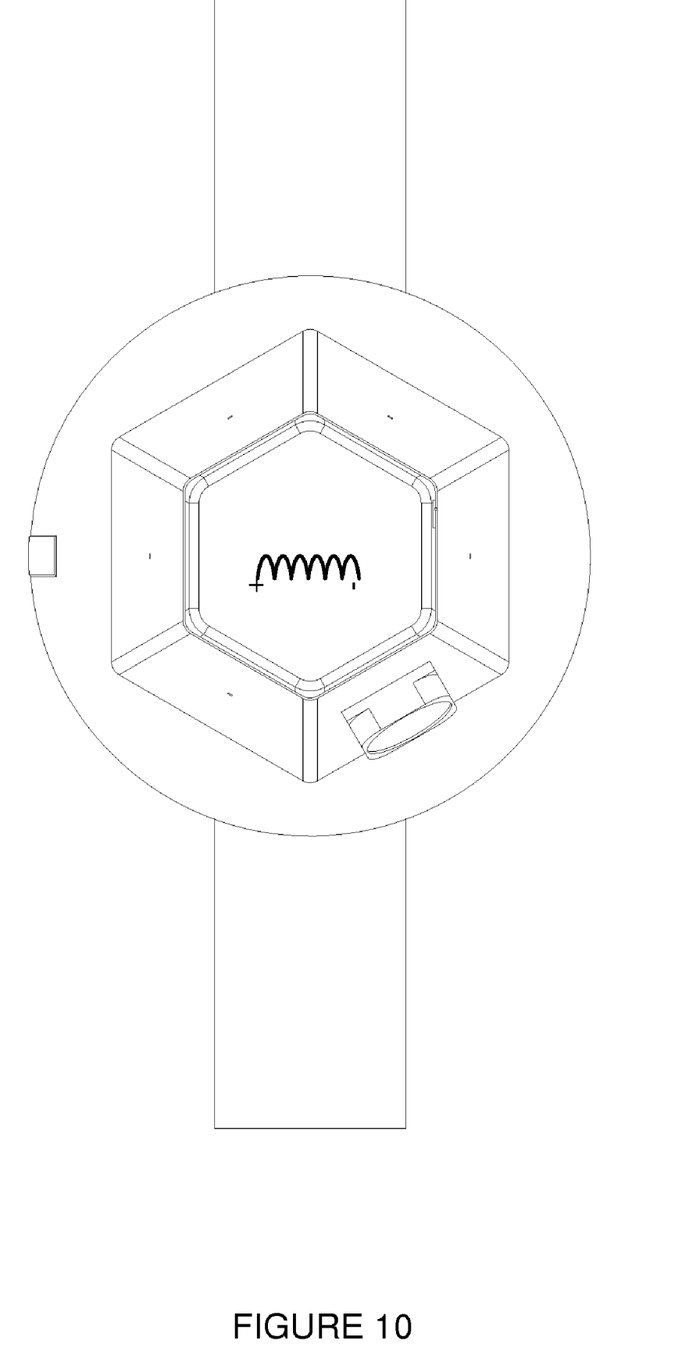
FIG. 10 depicts a bottom view of an alternate faulted circuit indicator including a rotatable display but utilizing a single light-emitting diode.
Figure 11:
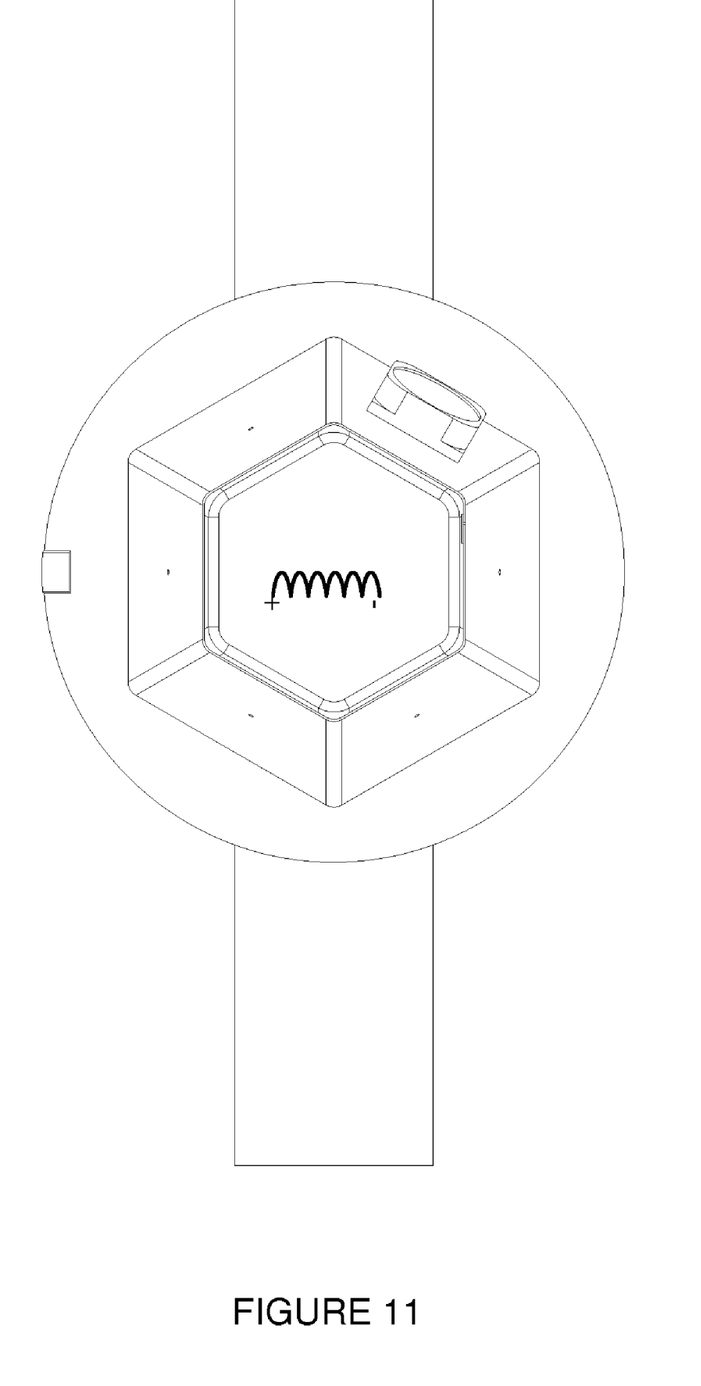
FIG. 11 depicts a bottom view of the faulted circuit indicator shown in FIG. 10 with the light-emitting diode rotated to an alternate position.

FIGS. 10 and 11 depict bottom views of a faulted circuit indicator similar to that depicted in FIGS. 7A and 7B, but including only a single LED mounted on a rotatable display. Depending on the type of LED used, this LED may be visible over an arc of approximately 120 degrees, and can be rotated to be visible from the determined angle of approach for maintenance personnel. The LED may be any color, such as for example, red or yellow, or alternatively, the LED may be a bi-color LED, such as a red and yellow bi-color LED. The LED may be flashed in distinct sequences to distinguish between the detection of a permanent or temporary fault. For example, and assuming that a bi-color LED is used, to indicate a permanent fault, the LED may be flashed first one color, then the other color, followed by a pause, at which point, the first color flash and second color flash are repeated. The time periods could be those used in FIG. 6A, discussed above. Similarly, to indicate a temporary fault, only one of the colors may be periodically flashed similarly to the method described in FIG. 6B above.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

What is claimed is:

1. A faulted circuit indicator comprising a housing, a current acquisition circuit disposed within the housing and adapted to monitor current within a power line, and a monitor circuit for determining when a fault has occurred on the power line, the monitor circuit in communication with the current acquisition circuit and disposed within the housing, the faulted circuit indicator further comprising:
   i) a plurality of lamps coupled to the monitor circuit and disposed on separate faces of a post such that at least one lamp is visible from any angle of approach to the faulted circuit indicator, the monitor circuit adapted to drive the plurality of lamps in a first predetermined flashing pattern upon the monitor circuit determining the presence of a fault on the power line, and in a second predetermined flashing pattern upon the monitor circuit determining clearing of the fault on the power line.

2. The faulted circuit indicator of claim 1 further comprising a clear end cap disposed on an end of the housing that faces downward relative to the power line when said faulted circuit indicator is installed, the plurality of lamps disposed within the clear end cap.

3. The faulted circuit indicator of claim 1 wherein the plurality of lamps is comprised of a plurality of light emitting diodes.

4. The faulted circuit indicator of claim 1 wherein the plurality of lamps are grouped into two separate colors, and the monitor circuit is adapted to terminate the first predetermined flashing pattern and the second predetermined flashing pattern comprising flashing those light-emitting diodes of similar color periodically in unison.

5. A faulted circuit indicator comprising a housing, a coil disposed within the housing and adapted to monitor current within a power line, and a monitor circuit for determining when a fault has occurred on the power line, the monitor circuit coupled to the coil and disposed within the housing, the faulted circuit indicator further comprising:
   i) a rotatable display comprising one or more lamps disposed on separate faces of a post, the rotatable display adapted to rotate such that the one or more lamps are viewable from a selected angle of approach when installed.

6. The faulted circuit indicator of claim 5 wherein the monitoring circuit is adapted to flash the one or more lamps in a predetermined pattern upon determining that a fault is present on the power line.

7. The faulted circuit indicator of claim 6 wherein the one or more lamps are comprised of two red light emitting diodes and one yellow light emitting diode.

8. The faulted circuit indicator of claim 7 wherein the yellow light emitting diode is flashed when a temporary fault is detected.

9. The faulted circuit indicator of claim 7 wherein the red light emitting diodes and the yellow light emitting diode are flashed in a predetermined pattern when a permanent fault is detected.

10. A faulted circuit indicator comprising a housing, a current acquisition circuit disposed within the housing and adapted to monitor current within a power line, and a monitor circuit for determining when a fault has occurred on the power line, the monitor circuit in communication with the current acquisition circuit and disposed within the housing, the faulted circuit indicator further comprising:
   i) a plurality of light-emitting diodes coupled to the monitor circuit and disposed on separate faces of a post, the monitor circuit adapted to drive the plurality of light-emitting diodes in a first predetermined flashing pattern upon the monitor circuit determining the presence of a fault on the power line, the monitor circuit being further adapted to terminate the first predetermined flashing pattern and drive the plurality of light-emitting_diodes in a second predetermined flashing pattern upon the monitor circuit determining clearing of the fault on the power line.

11. The faulted circuit indicator of claim 10, wherein the plurality of light-emitting diodes are grouped into two separate colors.

12. The faulted circuit indicator of claim 11, wherein the first predetermined pattern comprises a pattern using both groups of light-emitting diodes.

13. The faulted circuit indicator of claim 11, wherein the second predetermined pattern comprises a pattern using only one of the groups of light-emitting diodes.

14. The faulted circuit indicator of claim 10, wherein the light emitting diodes comprise multi-colored light emitting diodes.

15. The faulted circuit indicator of claim 10, wherein the plurality of light emitting diodes are disposed so that at least one light-emitting diode is visible from any angle of approach to the faulted circuit indicator as installed on the power line.

16. The faulted circuit indicator of claim 10, wherein the plurality of light emitting diodes are disposed so as to be visible from the most likely angle of approach to the faulted circuit indicator as installed on the power line.

17. The faulted circuit indicator of claim 16, further comprising a rotatable display housing the light emitting diodes and the monitor circuit, the rotatable display adapted to rotate so that the light emitting diodes are viewable from the most likely angle of approach to the faulted circuit indicator.

18. The faulted circuit indicator of claim 16, wherein the plurality of light emitting diodes are disposed so as to not be visible from a predetermined angle to the faulted circuit indicator as installed on the power line.

* * * * *